US012353237B2

(12) United States Patent
Lin (10) Patent No.: US 12,353,237 B2
(45) Date of Patent: Jul. 8, 2025

(54) VOLTAGE CONTROL OSCILLATING APPARATUS AND OPERATION METHOD THEREOF HAVING GAIN CALIBRATION MECHANISM

(71) Applicant: REALTEK SEMICONDUCTOR CORPORATION, Hsinchu (TW)

(72) Inventor: Yi-Jyun Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 88 days.

(21) Appl. No.: 18/388,543

(22) Filed: Nov. 10, 2023

(65) Prior Publication Data
US 2024/0160241 A1   May 16, 2024

(30) Foreign Application Priority Data
Nov. 14, 2022 (TW) .................................. 111143433

(51) Int. Cl.
*G06F 1/08* (2006.01)
*G06F 1/10* (2006.01)

(52) U.S. Cl.
CPC . *G06F 1/08* (2013.01); *G06F 1/10* (2013.01)

(58) Field of Classification Search
CPC ..................................... G06F 1/08; G06F 1/10
See application file for complete search history.

(56) References Cited

U.S. PATENT DOCUMENTS

| | | | |
|---|---|---|---|
| 11,095,297 B2 | 8/2021 | Gupta et al. | |
| 2005/0146315 A1* | 7/2005 | Burton | G06F 1/26 323/293 |
| 2013/0035797 A1* | 2/2013 | Allen-Ware | G06F 1/324 700/286 |
| 2016/0112052 A1* | 4/2016 | Sheafor | G01R 19/0084 331/44 |
| 2017/0222744 A1* | 8/2017 | Huang | H04J 3/0667 |
| 2018/0081389 A1* | 3/2018 | Wu | H04N 5/04 |
| 2018/0081582 A1* | 3/2018 | Chun | G06F 11/3037 |
| 2018/0164340 A1* | 6/2018 | Ueno | H04M 1/72454 |

(Continued)

FOREIGN PATENT DOCUMENTS

CN   112073061 A   12/2020

*Primary Examiner* — Phil K Nguyen
(74) *Attorney, Agent, or Firm* — WPAT, PC (57) ABSTRACT

The present disclosure discloses a voltage control oscillating apparatus having gain calibration mechanism. A voltage control oscillating circuit converts a control voltage to a control current to generate an output clock signal having an output frequency. A first calibration circuit controls the voltage control oscillating circuit to perform a first calibration process that includes setting the control voltage as a first voltage, determining a first frequency difference between the output frequency and a first target frequency and adjusting the control current accordingly to approximate the output frequency to the first target frequency. A second calibration circuit controls the voltage control oscillating circuit to perform a second calibration process that includes setting the control voltage as a second voltage, determining a second frequency difference between the output frequency and a second target frequency and adjusting the control current accordingly to approximate the output frequency to the second target frequency.

12 Claims, 4 Drawing Sheets

(56) References Cited

U.S. PATENT DOCUMENTS

2022/0114944 A1\* 4/2022 Duan ................. G06F 1/08
2023/0155582 A1\* 5/2023 Lan .................. H03K 3/037
                                                                    327/291
2024/0069591 A1\* 2/2024 Nie ................... G06F 1/08

\* cited by examiner

VOLTAGE CONTROL OSCILLATING APPARATUS AND OPERATION METHOD THEREOF HAVING GAIN CALIBRATION MECHANISM

BACKGROUND OF THE INVENTION

1. Field of the Invention

The present disclosure relates to a voltage control oscillating apparatus and an operation method thereof having gain calibration mechanism.

2. Description of Related Art

A voltage-controlled oscillator (VCO) is an electronic oscillating circuit designed to control an oscillating frequency according to a voltage input. In some approaches, the voltage-controlled oscillator is implemented by a circuit that converts the control voltage to a current first and performs oscillation according to a current control oscillator to generate a clock signal having a required frequency.

However, the current that converts the voltage to the current is easily affected by the manufacturing process variation. Even two circuits manufactured from the same die may have ±10% difference therebewteen. Under such a condition, the performance of the gain of the manufactured voltage-controlled oscillator becomes unstable.

SUMMARY OF THE INVENTION

In consideration of the problem of the prior art, an object of the present disclosure is to provide a voltage control oscillating apparatus and an operation method thereof having gain calibration mechanism.

The present invention discloses a voltage control oscillating apparatus having gain calibration mechanism that includes a voltage control oscillating circuit, a first calibration circuit and a second calibration circuit. The voltage control oscillating circuit is configured to convert a control voltage to a control current according to a conversion parameter to oscillate according to the control current to generate an output clock signal having an output frequency. The first calibration circuit is configured to control the voltage control oscillating circuit to perform a first calibration process that includes steps outlined below. The control voltage is set to be a first voltage value. A first frequency difference between the output frequency and a first target frequency is determined. A current adjusting signal is generated according to the first frequency difference to adjust the control current to further adjust the output frequency to approximate the output frequency to the first target frequency until an absolute value of the first frequency difference is smaller than a first predetermined value. The second calibration circuit is configured to control the voltage control oscillating circuit to perform a second calibration process that includes steps outlined below. The control voltage is set to be a second voltage value. A second frequency difference between the output frequency and a second target frequency is determined. A parameter adjusting signal is generated according to the second frequency difference to further adjust the output frequency to approximate the output frequency to the second target frequency until an absolute value of the second frequency difference is smaller than a second predetermined value.

The present invention also discloses a voltage control oscillating apparatus operation method having gain calibration mechanism that includes steps outlined below. A control voltage is converted to a control current according to a conversion parameter to oscillate according to the control current to generate an output clock signal having an output frequency by a voltage control oscillating circuit. The voltage control oscillating circuit is controlled to perform a first calibration process by a first calibration circuit. The first calibration process includes steps outlined below. The control voltage is set to be a first voltage value. A first frequency difference between the output frequency and a first target frequency is determined. A current adjusting signal is generated according to the first frequency difference to adjust the control current to further adjust the output frequency to approximate the output frequency to the first target frequency until an absolute value of the first frequency difference is smaller than a first predetermined value. The voltage control oscillating circuit is controlled to perform a second calibration process by a second calibration circuit. The second calibration process includes steps outlined below. The control voltage is set to be a second voltage value. A second frequency difference between the output frequency and a second target frequency is determined. A parameter adjusting signal is generated according to the second frequency difference to further adjust the output frequency to approximate the output frequency to the second target frequency until an absolute value of the second frequency difference is smaller than a second predetermined value.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a voltage control oscillating apparatus and an operation method thereof having gain calibration mechanism to perform two stages of calibration processes on the voltage control oscillating apparatus such that a gain of the voltage control oscillating apparatus is not affected by the manufacturing process variation.

Figure 1:
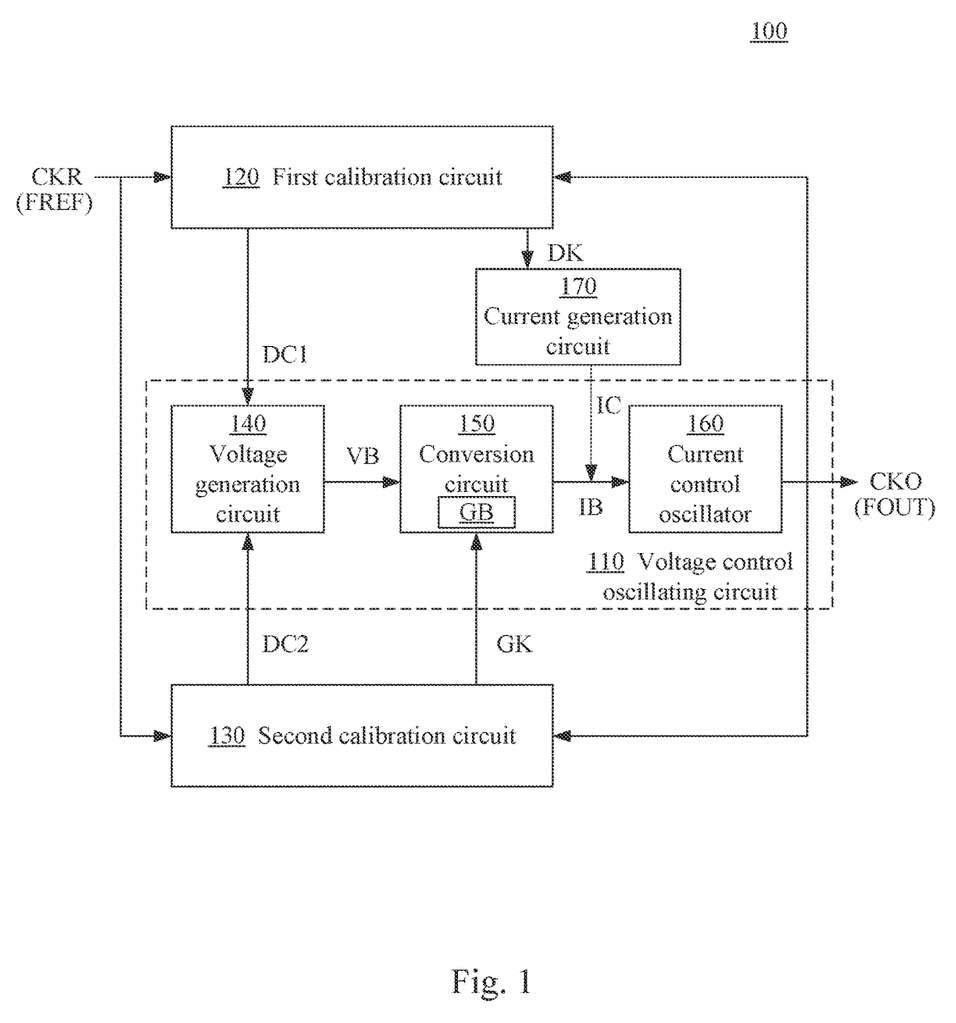
FIG. 1 illustrates a block diagram of a voltage control oscillating apparatus having gain calibration mechanism according to an embodiment of the present invention.

Reference is now made to FIG. 1. FIG. 1 illustrates a block diagram of a voltage control oscillating apparatus 100 having gain calibration mechanism according to an embodiment of the present invention. The voltage control oscillating apparatus 100 includes a voltage control oscillating circuit 110, a first calibration circuit 120 and a second calibration circuit 130.

The voltage control oscillating circuit 110 is configured to convert a control voltage VB to a control current IB according to a conversion parameter GB to oscillate according to the control current IB to generate an output clock signal CKO having an output frequency FOUT. In an embodiment, the voltage control oscillating circuit 110 includes a voltage generation circuit 140, a conversion circuit 150 and a current control oscillator 160.

The voltage generation circuit 140 is configured to generate the control voltage VB. In an embodiment, the voltage generation circuit 140 is controlled by a signal in a digital form to generate the control voltage VB in the analog form.

The conversion circuit 150 is configured to receive and convert the control voltage VB to the control current IB according to the conversion parameter GB.

The current control oscillator 160 is configured to oscillate according to the control current IB to generate the output clock signal CKO.

The first calibration circuit 120 is configured to control the voltage control oscillating circuit 110 to perform a first calibration process, wherein the first calibration process is performed according to the signals generated by the first calibration circuit 120 that control the operation of the voltage control oscillating circuit 110.

At first, the first calibration process includes setting the control voltage VB to be a first voltage value.

In an embodiment, the first calibration circuit 120 generates a first digital control signal DC1 to the voltage generation circuit 140 to set the control voltage VB to be the first voltage value.

Subsequently, the first calibration process includes determining a first frequency difference between the output frequency FOUT and a first target frequency.

In an embodiment, the first calibration circuit 120 receives the output clock signal CKO and a reference clock signal CKR having a known reference frequency FREF to obtain a value of the output frequency FOUT based on a comparison made between the output clock signal CKO and the reference clock signal CKR, so as to determine the first frequency difference between the output frequency FOUT and the first target frequency.

More specifically, in an embodiment, the known reference frequency FREF of the reference clock signal CKR can be smaller than the output frequency FOUT of the output clock signal CKO such that the first calibration circuit 120 performs counting on the reference clock signal CKR according to the output clock signal CKO that has a faster speed to calculate the output frequency FOUT and further determines the first frequency difference between the output frequency FOUT and the first target frequency.

Further, the first calibration process includes generating a current adjusting signal DK according to the first frequency difference to adjust the control current IB to further adjust the output frequency FOUT to approximate the output frequency FOUT to the first target frequency until an absolute value of the first frequency difference is smaller than a first predetermined value.

The first calibration circuit 120 determines whether the absolute value of the first frequency difference is smaller than the first predetermined value first and performs adjusting when the absolute value of the first frequency difference is not smaller than the first predetermined value.

In an embodiment, the voltage control oscillating apparatus 100 further includes a current generation circuit 170. The first calibration circuit 120 is configured to generate the current adjusting signal DK in the digital form such that the current generation circuit 170 generates an adjusting current IC in the analog form according to the current adjusting signal DK to be superimposed to the control current IB to adjust the control current IB.

As a result, the current control oscillator 160 actually receives the superimposition result of the control current IB and the adjusting current IC and oscillates accordingly to adjust the output frequency FOUT of the output clock signal CKO.

In an embodiment, when the output frequency FOUT is smaller than the first target frequency, the first calibration circuit 120 uses the current adjusting signal DK to increase the current value of the adjusting current IC such that a positive adjusting is performed on the control current IB to increase the output frequency FOUT. When the output frequency FOUT is larger than the first target frequency, the first calibration circuit 120 uses the current adjusting signal DK to decrease the current value of the adjusting current IC such that a negative adjusting is performed on the control current IB to decrease the output frequency FOUT.

After the control current IB is adjusted, the first calibration circuit 120 determines the first frequency difference by using the method described above again and determines whether the absolute value of the first frequency difference is smaller than the first predetermined value again. When the absolute value of the first frequency difference is still not smaller than the first predetermined value, the first calibration circuit 120 keeps performing adjusting. When the absolute value of the first frequency difference is smaller than first predetermined value, the first calibration circuit 120 determines that the output frequency FOUT and the first target frequency are close enough and finishes performing the first calibration process.

It is appreciated that the adjusting method described above is merely an example. When the current control oscillator 160 is designed such that an adjusting direction of the output frequency is inverse to the variation of the control current, the current adjusting signal DK can adjust the current value of the adjusting current IC with a mechanism inverse to that described above so as to adjust the output frequency FOUT.

The second calibration circuit 130 is configured to control the voltage control oscillating circuit 110 to perform the second calibration process, wherein the second calibration process is performed according to the signals generated by the second calibration circuit 130 that control the operation of the voltage control oscillating circuit 110.

At first, the second calibration process includes setting the control voltage VB to be a second voltage value.

In an embodiment, the second calibration circuit 130 generates a second digital control signal DC2 to the voltage generation circuit 140 to set the control voltage VB to be the second voltage value.

Subsequently, second calibration process includes determining a second frequency difference between the output frequency FOUT and a second target frequency.

In an embodiment, the second calibration circuit 130 receives the output clock signal CKO and the reference clock signal CKR having the known reference frequency FREF to obtain a value of the output frequency FOUT based on a comparison made between the output clock signal CKO and the reference clock signal CKR, so as to determine the second frequency difference between the output frequency FOUT and the second target frequency. The second calibration circuit 130 may perform the determination of the frequency difference based on the operation mechanism same as that of the first calibration circuit 120. The detail is not described herein.

Further, the second calibration process includes generating a parameter adjusting signal GK according to the second frequency difference to adjust the conversion parameter GB to further adjust the output frequency FOUT to approximate the output frequency FOUT to the second target frequency until an absolute value of the second frequency difference is smaller than a second predetermined value.

The second calibration circuit 130 determines whether the absolute value of the second frequency difference is smaller than the second predetermined value first and performs adjusting when the absolute value of the second frequency difference is not smaller than the second predetermined value.

In an embodiment, when the output frequency FOUT is smaller than the second target frequency, the second calibration circuit 130 uses the parameter adjusting signal GK to increase the value of the conversion parameter GB such that a positive adjusting is performed on the control current IB to increase the output frequency FOUT. When the output frequency FOUT is larger than the second target frequency, the second calibration circuit 130 uses the parameter adjusting signal GK to decrease the value of the conversion parameter GB such that a negative adjusting is performed on the control current IB to decrease the output frequency FOUT.

After the conversion parameter GB is adjusted, the second calibration circuit 130 determines the second frequency difference by using the method described above again and determines whether the absolute value of the second frequency difference is smaller than the second predetermined value again. When the absolute value of the second frequency difference is still not smaller than the second predetermined value, the second calibration circuit 130 keeps performing adjusting. When the absolute value of the second frequency difference is smaller than the second predetermined value, the second calibration circuit 130 determines that the output frequency FOUT and second target frequency are close enough and finishes performing the second calibration process.

In different embodiments, the second predetermined value and the first predetermined value can be set to be the same or be different depending on practical requirements.

It is appreciated that the adjusting method described above is merely an example. When the current control oscillator 160 is designed such that an adjusting direction of the output frequency is inverse to the variation of the control current, the parameter adjusting signal GK can adjust the current value of the conversion parameter GB with a mechanism inverse to that described above so as to adjust the output frequency FOUT.

In an embodiment, the first calibration circuit 120 and the second calibration circuit 130 may repeat performing the first calibration process and the second calibration process such that the output clock signal generated by the voltage control oscillating circuit has a stable gain.

Figure 2:
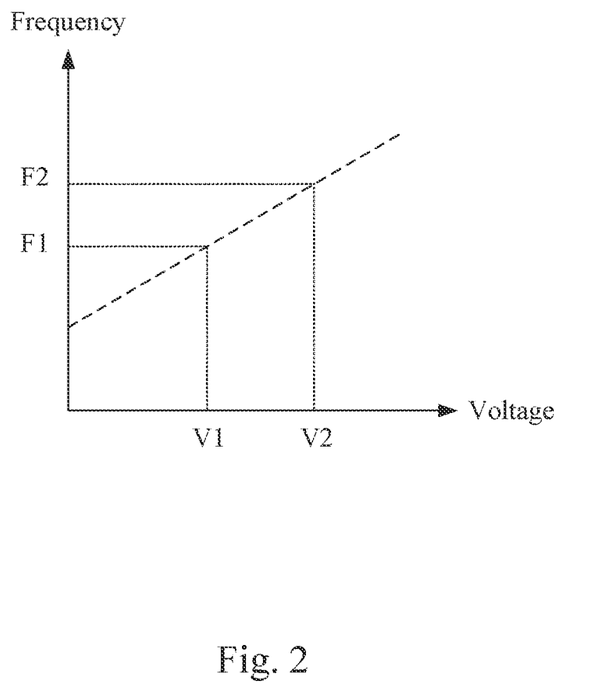
FIG. 2 illustrates a diagram of the relation between the control voltage and the output frequency according to an embodiment of the present invention.

Reference is now made to FIG. 2. FIG. 2 illustrates a diagram of the relation between the control voltage VB and the output frequency FOUT according to an embodiment of the present invention. In FIG. 2, the Y axis represents frequencies and the X axis represents the voltage values.

The gain of the voltage control oscillating apparatus 100 is $K_{VCO}$ and is represented by the following equation:

$$K_{VCO} = \Delta FOUT/\Delta V \quad \text{(equation 1)}$$

As illustrated in FIG. 2, the control voltage VB can be set to be a first voltage value V1 and a second voltage value V2 that respectively corresponding to a first target frequency F1 and a second target frequency F2. The equation 1 can be further represented as:

$$K_{VCO} = (F2-F1)/(V2-V1) \quad \text{(equation 2)}$$

In some approaches, since the conversion circuit that converts the voltage to the current is easily affected by the variation of the manufacturing process, variations of the gain of the voltage control oscillating apparatus are thus generated and can not be kept to be stable.

The voltage control oscillating apparatus of the present invention sets the first voltage value V1 and the second voltage value V2 depending on practical requirements by using the first calibration circuit 120 and the second calibration circuit 130 such that two stages of calibration processes are performed to calibrate the output clock signal generated by the voltage control oscillating circuit. Corresponding to the first voltage value V1 and the second voltage value V2, the output frequency can be respectively fixed at the first target frequency F1 and the second target frequency F2 in a stable manner. The gain $K_{VCO}$ in the equation 2 can become stable accordingly without being affected by the variation of the manufacturing process.

Figure 3:
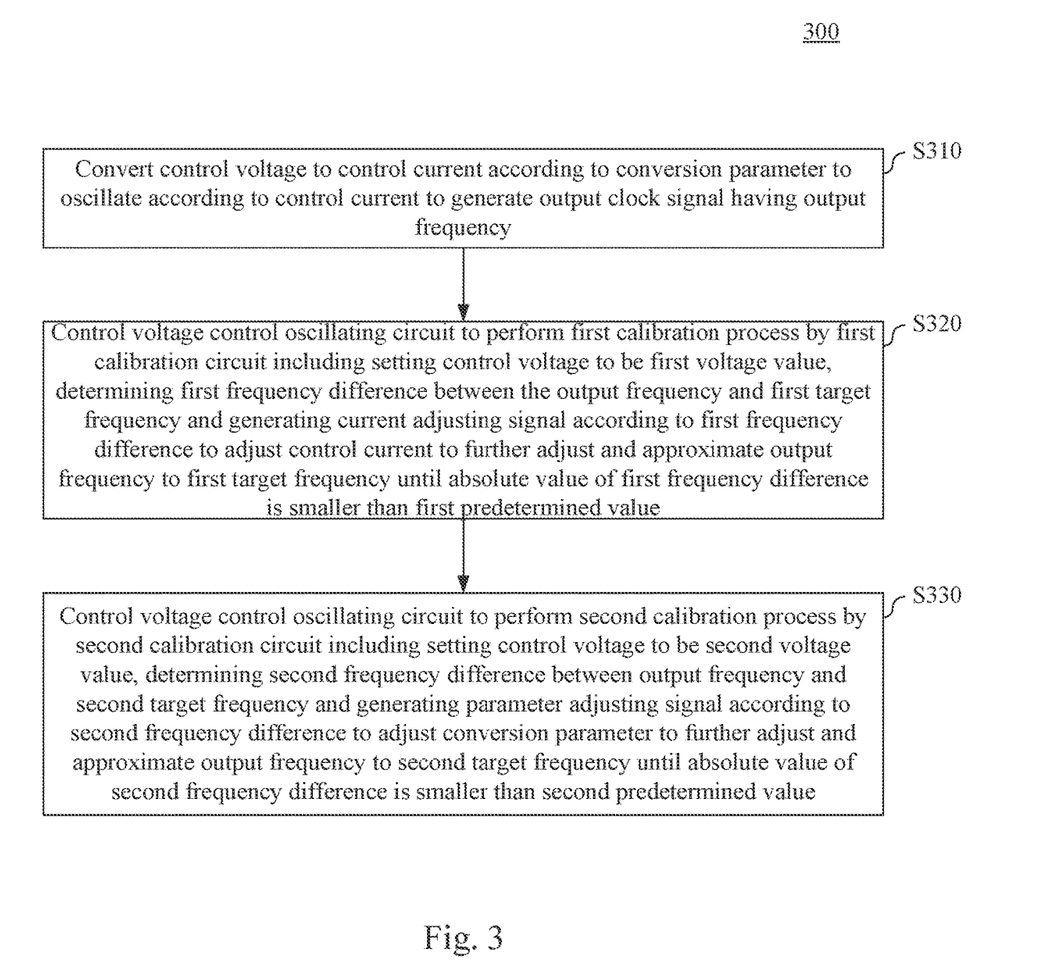
FIG. 3 illustrates a voltage control oscillating apparatus operation method having gain calibration mechanism according to an embodiment of the present invention.

Reference is now made to FIG. 3. FIG. 3 illustrates a voltage control oscillating apparatus operation method 300 having gain calibration mechanism according to an embodiment of the present invention.

Besides the apparatus described above, the present invention further discloses the voltage control oscillating apparatus operation method 300 that can be used in such as, but not limited to the voltage control oscillating apparatus 100 illustrated in FIG. 1. An embodiment of the voltage control oscillating apparatus operation method 300 is illustrated in FIG. 3 and includes the steps outlined below.

In step S310, the control voltage VB is converted to the control current IB according to the conversion parameter GB to oscillate according to the control current IB to generate the output clock signal CKO having the output frequency FOUT by the voltage control oscillating circuit 110.

In step S320, the voltage control oscillating circuit 110 is controlled to perform the first calibration process by the first calibration circuit 120, the first calibration process including setting the control voltage VB to be the first voltage value, determining the first frequency difference between the output frequency FOUT and the first target frequency and generating the current adjusting signal DK according to the first frequency difference to adjust the control current IB to further adjust the output frequency FOUT to approximate the output frequency FOUT to the first target frequency until the absolute value of the first frequency difference is smaller than the first predetermined value.

In step S330, the voltage control oscillating circuit 110 is controlled to perform the second calibration process by the second calibration circuit 130, the second calibration process including setting the control voltage VB to be the second voltage value, determining the second frequency difference between the output frequency FOUT and the second target frequency and generating the parameter adjusting signal GK according to the second frequency difference to adjust the conversion parameter GB to further adjust the output frequency FOUT to approximate the output frequency FOUT to the second target frequency until the absolute value of the second frequency difference is smaller than the second predetermined value.

Figure 4:
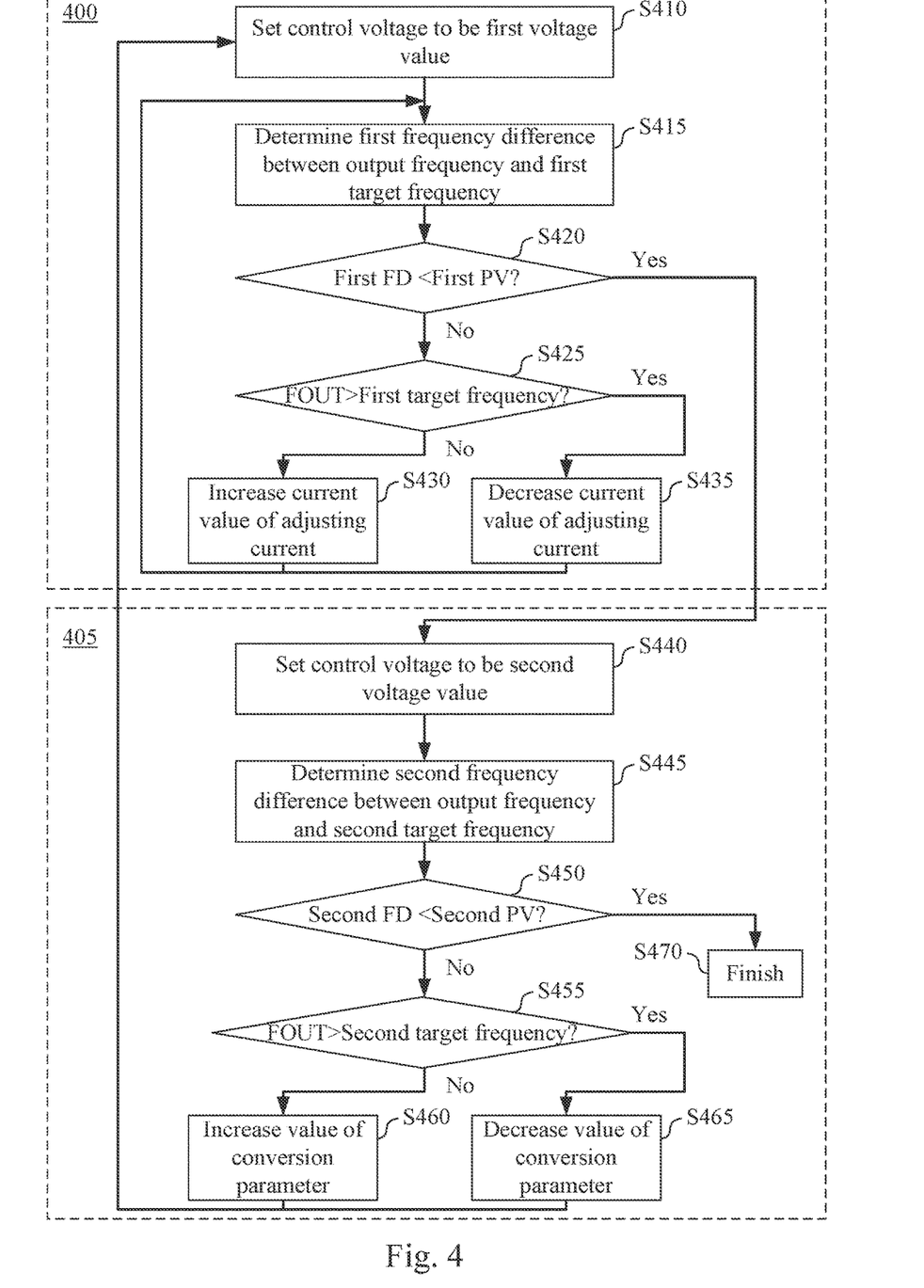
FIG. 4 illustrates a more detailed flow chart of a first calibration process and a second calibration process according to an embodiment of the present invention.

Reference is now made to FIG. 4. FIG. 4 illustrates a more detailed flow chart of a first calibration process 400 and a second calibration process 405 according to an embodiment of the present invention.

In step S410, the first calibration process 400 begins and the first calibration circuit 120 controls the voltage control oscillating circuit 110 to set the control voltage VB to be the first voltage value.

In step S415, the first calibration circuit 120 determines the first frequency difference between the output frequency FOUT and the first target frequency.

In step S420, the first calibration circuit 120 determines whether the absolute value of the first frequency difference (abbreviated as first FD in FIG. 4) is smaller than the first predetermined value (abbreviated as first PV in FIG. 4) according to the first frequency difference.

In step S425, when the absolute value of the first frequency difference is not smaller than the first predetermined value, the first calibration circuit 120 determines whether the output frequency FOUT is larger than the first target frequency according to the first frequency difference.

In step S430, when the output frequency FOUT is not larger than the first target frequency, the first calibration circuit 120 generates the current adjusting signal DK to increase the current value of the adjusting current IC to perform positive adjusting on the control current IB to increase the output frequency FOUT. The flow goes back to step S415 to determine the first frequency difference again so as to perform the subsequent steps according to the first frequency difference.

In step S435, when the output frequency FOUT is larger than the first target frequency, the first calibration circuit 120 generates the current adjusting signal DK to decrease the current value of the adjusting current IC to perform negative adjusting on the control current IB to decrease the output frequency FOUT. The flow goes back to step S415 to determine the first frequency difference again so as to perform the subsequent steps according to the first frequency difference.

In step S440, when the absolute value of the first frequency difference is determined to be smaller than the first predetermined value in step S420, the first calibration process 400 finishes and the second calibration process 405 begins. The second calibration circuit 130 controls the voltage control oscillating circuit 110 to set the control voltage VB to be the second voltage value.

In step S445, the second calibration circuit 130 determines the second frequency difference between the output frequency FOUT and the second target frequency.

In step S450, the second calibration circuit 130 determines whether the absolute value of the second frequency difference (abbreviated as second FD in FIG. 4) is smaller than the second predetermined value (abbreviated as second PV in FIG. 4) according to the second frequency difference.

In step S455, when the absolute value of the second frequency difference is not smaller than second predetermined value, the second calibration circuit 130 determines whether the output frequency FOUT is larger than the second target frequency according to the second frequency difference.

In step S460, when the output frequency FOUT is not larger than the second target frequency, the second calibration circuit 130 generates the parameter adjusting signal GK increase the value of the conversion parameter GB to perform positive adjusting on the control current IB to increase the output frequency FOUT. The flow goes back to step S410 to restart the first calibration process 400.

In step S465, when the output frequency FOUT is larger than the second target frequency, the second calibration circuit 130 generates the parameter adjusting signal GK to decrease the value of the conversion parameter GB to perform negative adjusting on the control current IB to decrease the output frequency FOUT. The flow goes back to step S410 to restart the first calibration process 400.

In step S470, when the absolute value of the second frequency difference is determined to be smaller than the second predetermined value in step S450, the second calibration process 405 finishes.

It is appreciated that the embodiments described above are merely an example. In other embodiments, it is appreciated that many modifications and changes may be made by those of ordinary skill in the art without departing from the spirit of the invention.

In summary, the voltage control oscillating apparatus and the operation method thereof having gain calibration mechanism perform two stages of calibration processes on the voltage control oscillating apparatus such that a gain of the voltage control oscillating apparatus is not affected by the manufacturing process variation.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A voltage control oscillating apparatus having gain calibration mechanism comprising:
   a voltage control oscillating circuit configured to convert a control voltage to a control current according to a conversion parameter to oscillate according to the control current to generate an output clock signal having an output frequency;
   a first calibration circuit configured to control the voltage control oscillating circuit to perform a first calibration process comprising:
      setting the control voltage to be a first voltage value;
      determining a first frequency difference between the output frequency and a first target frequency; and
      generating a current adjusting signal according to the first frequency difference to adjust the control current to further adjust the output frequency to approximate the output frequency to the first target frequency until an absolute value of the first frequency difference is smaller than a first predetermined value; and
   a second calibration circuit configured to control the voltage control oscillating circuit to perform a second calibration process comprising:
      setting the control voltage to be a second voltage value;
      determining a second frequency difference between the output frequency and a second target frequency; and
      generating a parameter adjusting signal according to the second frequency difference to further adjust the output frequency to approximate the output frequency to the second target frequency until an absolute value of the second frequency difference is smaller than a second predetermined value.

2. The voltage control oscillating apparatus of claim 1, wherein the first calibration circuit and the second calibration circuit repeats performing the first calibration process and the second calibration process.

3. The voltage control oscillating apparatus of claim 1, wherein the voltage control oscillating circuit comprises:

a voltage generation circuit configured to generate the control voltage;

a conversion circuit configured to receive and convert the control voltage to the control current according to the conversion parameter; and a current control oscillator configured to oscillate according to the control current to generate the output clock signal.

4. The voltage control oscillating apparatus of claim 3, wherein the first calibration circuit generate a first digital control signal to the voltage generation circuit to set the control voltage to be the first voltage value and generate the current adjusting signal to adjust the control current;

the second calibration circuit generate a second digital control signal to the voltage generation circuit to set the control voltage to be the second voltage value and generate the parameter adjusting signal to the conversion circuit to adjust the conversion parameter.

5. The voltage control oscillating apparatus of claim 4, further comprising a current generation circuit configured to generate an adjusting current according to the current adjusting signal to be superimposed to the control current to perform adjusting.

6. The voltage control oscillating apparatus of claim 1, wherein the first calibration circuit receives the output clock signal and a reference clock signal having a known reference frequency to obtain a value of the output frequency based on a comparison made between the output clock signal and the reference clock signal, so as to determine the first frequency difference between the output frequency and the first target frequency;

the second calibration circuit receives the output clock signal having the output frequency and the reference clock signal to obtain the value of the output frequency based on a comparison made between the output clock signal and the reference clock signal, so as to determine the second frequency difference between the output frequency and the second target frequency.

7. A voltage control oscillating apparatus operation method having gain calibration mechanism comprising:

converting a control voltage to a control current according to a conversion parameter to oscillate according to the control current to generate an output clock signal having an output frequency by a voltage control oscillating circuit;

controlling the voltage control oscillating circuit to perform a first calibration process by a first calibration circuit, the first calibration process comprising:
setting the control voltage to be a first voltage value;
determining a first frequency difference between the output frequency and a first target frequency; and
generating a current adjusting signal according to the first frequency difference to adjust the control current to further adjust the output frequency to approximate the output frequency to the first target frequency until an absolute value of the first frequency difference is smaller than a first predetermined value; and controlling the voltage control oscillating circuit to perform a second calibration process by a second calibration circuit, the second calibration process comprising:
setting the control voltage to be a second voltage value;
determining a second frequency difference between the output frequency and a second target frequency; and
generating a parameter adjusting signal according to the second frequency difference to further adjust the output frequency to approximate the output frequency to the second target frequency until an absolute value of the second frequency difference is smaller than a second predetermined value.

8. The voltage control oscillating apparatus operation method of claim 7, further comprising:
repeating performing the first calibration process and the second calibration process by the first calibration circuit and the second calibration circuit.

9. The voltage control oscillating apparatus operation method of claim 7, further comprising:
generating the control voltage by a voltage generation circuit comprised by the voltage control oscillating circuit;
receiving and converting the control voltage to the control current according to the conversion parameter by a conversion circuit comprised by the voltage control oscillating circuit; and
oscillating according to the control current to generate the output clock signal by a current control oscillator comprised by the voltage control oscillating circuit; and
generating the current adjusting signal to adjust the control current by the first calibration circuit.

10. The voltage control oscillating apparatus operation method of claim 9, further comprising:
generating a first digital control signal to the voltage generation circuit to set the control voltage to be the first voltage value and generating the current adjusting signal to adjust the control current by the first calibration circuit; and
generating a second digital control signal to the voltage generation circuit to set the control voltage to be the second voltage value and generating the parameter adjusting signal to the conversion circuit to adjust the conversion parameter by the second calibration circuit.

11. The voltage control oscillating apparatus operation method of claim 10, further comprising:
generating an adjusting current according to the current adjusting signal to be superimposed to the control current to perform adjusting by a current generation circuit.

12. The voltage control oscillating apparatus operation method of claim 7, further comprising:
receiving the output clock signal and a reference clock signal having a known reference frequency to obtain a value of the output frequency based on a comparison made between the output clock signal and the reference clock signal, so as to determine the first frequency difference between the output frequency and the first target frequency by the first calibration circuit; and
receiving the output clock signal having the output frequency and the reference clock signal to obtain the value of the output frequency based on a comparison made between the output clock signal and the reference clock signal, so as to determine the second frequency difference between the output frequency and the second target frequency by the second calibration circuit.

* * * * *